(12) United States Patent
Sugahara

(10) Patent No.: US 7,286,354 B2
(45) Date of Patent: Oct. 23, 2007

(54) ELECTRONIC PART-MOUNTED SUBSTRATE, THERMAL CONDUCTIVE MEMBER FOR ELECTRONIC PART-MOUNTED SUBSTRATE AND LIQUID-JETTING HEAD

(75) Inventor: Hiroto Sugahara, Aichi-ken (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 26 days.

(21) Appl. No.: 11/261,141

(22) Filed: Oct. 27, 2005

(65) Prior Publication Data

US 2006/0092235 A1    May 4, 2006

(30) Foreign Application Priority Data

Oct. 27, 2004   (JP)   ............... 2004-312050

(51) Int. Cl.
  *H05K 7/20*   (2006.01)
(52) U.S. Cl. ..................................... 361/699
(58) Field of Classification Search ................ 361/699, 361/704, 761, 714, 764; 257/720, 711
  See application file for complete search history.

(56) References Cited

U.S. PATENT DOCUMENTS

| 5,198,693 | A | 3/1993 | Imken et al. |
| 5,764,484 | A * | 6/1998 | Hoffman et al. ............ 361/761 |
| 5,880,525 | A * | 3/1999 | Boudreau et al. ........... 257/752 |
| 5,992,963 | A | 11/1999 | Miyake et al. |
| 6,074,035 | A | 6/2000 | Irizawa et al. |
| 6,219,238 | B1 * | 4/2001 | Andros et al. ............... 361/704 |
| 6,246,583 | B1 * | 6/2001 | Cronin et al. ............... 361/704 |
| 6,386,672 | B1 | 5/2002 | Kimura et al. |
| 2006/0023436 | A1 | 2/2006 | Sugahara |

FOREIGN PATENT DOCUMENTS

| DE | 29510275 | 8/1995 |
| EP | 0 691 803 | 1/1996 |
| EP | 1 148 547 | 10/2001 |
| EP | 1 249 869 | 10/2002 |
| EP | 1 622 198 | 2/2006 |
| JP | 7-304168 | 11/1995 |
| JP | 8-72249 | 3/1996 |
| JP | 8-267732 | 10/1996 |
| JP | 11-97818 | 4/1999 |
| JP | 2001-253075 | 9/2001 |
| JP | 2003-76445 | 3/2003 |
| WO | WO 01/06821 | 1/2001 |

* cited by examiner

*Primary Examiner*—J. F. Duverne
(74) *Attorney, Agent, or Firm*—Reed Smith LLP

(57) ABSTRACT

An electronic part-mounted substrate includes a plate made of metal, an insulating material layer which is formed of a ceramic material on a surface of the plate and which has a surface provided with a heat generating IC thereon, and a thermal conductive member which is provided on a surface of IC. The heat, which is generated by IC, is transmitted via the thermal conductive member to the insulating material layer and the plate, and the heat is dissipated to the outside. The heat generated by the electronic part can be dissipated more efficiently. The substrate is applicable to a liquid-jetting head.

21 Claims, 14 Drawing Sheets

ELECTRONIC PART-MOUNTED SUBSTRATE, THERMAL CONDUCTIVE MEMBER FOR ELECTRONIC PART-MOUNTED SUBSTRATE AND LIQUID-JETTING HEAD

BACKGROUND OF THE INVENTION

1. Field of the Invention

The present invention relates to an electronic part-mounted substrate on which a heat-generating electronic part such as IC is provided, and a liquid-jetting head such as an ink-jet head.

2. Description of the Related Art

The electronic equipment such as mobile phones and personal computers includes a large number of electronic parts such as IC's (integrated circuits), resistors, and capacitors mounted on the surface of the substrate or the circuit board. Those widely used as the substrate on which the electronic parts as described above are mounted include those obtained by impregnating the surface of the glass cloth with the epoxy resin (glass epoxy substrate). When any heat-generating electronic part such as IC is provided on the substrate, it is necessary that the heat, which is generated from the electronic part, is reliably dissipated to the outside in order to prevent the electronic part itself or any part disposed therearound from being destroyed by the heat generated from the electronic part. However, in recent years, there is such a tendency that a large number of electronic parts are arranged and clustered in a narrow area on the substrate in order to miniaturize the electronic equipment. Therefore, it is more difficult to dissipate the heat generated from the heat-generating electronic part to the outside. In view of the above, a variety of electronic apparatuses have been suggested, which make it possible to efficiently dissipate the heat generated from the electronic part.

For example, an electronic apparatus described in Japanese Patent Application Laid-open No. 2003-76445 (FIG. 2) is provided with a thermal conductor constructed of a metal plate or the like which makes contact with the surface of a heat-generating electronic part such as CPU, a cooling fan which is installed in the vicinity of the thermal conductor, and a heat exchange section which transmits the heat transmitted from the electronic part to the thermal conductor to a heat transfer medium. The heat, which is transmitted from the electronic part to the thermal conductor, is transmitted at the heat exchange section to the heat transfer medium (fluid). The heat is dissipated to the outside via the heat transfer medium.

However, even when the apparatus is constructed so that the heat dissipation is facilitated from the surface of the electronic part as in the electronic apparatus described in Japanese Patent Application Laid-open No. 2003-76445, the heat is scarcely dissipated from the substrate, because the substrate, on which the electronic part is mounted, is composed of a material such as epoxy resin which has a low coefficient of thermal conductivity. Therefore, it is feared that the heat, which is generated by the electronic part, is not dissipated sufficiently, and the temperature of the electronic part is excessively increased.

SUMMARY OF THE INVENTION

An object of the present invention is to provide an electronic part-mounted substrate which makes it possible to more efficiently dissipate the heat generated from the electronic part, a thermal conductive member which is usable for the substrate, and a liquid-jetting head such as an ink-jet head.

According to a first aspect of the present invention, there is provided an electronic part-mounted substrate comprising a base member which is made of metal; an insulating material layer which is formed of an insulating ceramic material on one surface of the base member; a heat-generating electronic part which is provided on a surface of the insulating material layer; and a thermal conductive member which makes contact with both of the electronic part and the insulating material layer.

The electronic part-mounted substrate of the present invention is a module in which the electronic part and the thermal conductive member are carried on the substrate provided with the base member and the insulating material layer. In the electronic part-mounted substrate, the heat, which is generated by the electronic part, is transmitted from the portion arranged on the insulating material layer to the base member made of metal and the insulating material layer having the high coefficient of thermal conductivity, and the heat is dissipated to the outside. Further, the thermal conductive member, which makes contact with both of the electronic part and the insulating material layer, makes it possible to reliably transmit the heat generated by the electronic part to the base member made of metal and the insulating material layer having the high coefficient of thermal conductivity. Therefore, it is possible to dissipate the heat to the outside more efficiently.

In the electronic part-mounted substrate of the present invention, when the electronic part is provided with a casing having a plurality of surfaces, the thermal conductive member may make contact with a flat surface of the plurality of surfaces, the flat surface having the largest areal size among the surfaces. Accordingly, it is possible to sufficiently secure the contact area of the thermal conductive member with respect to the electronic part. Therefore, the heat, which is generated by the electronic part, is more efficiently transmitted from the thermal conductive member to the insulating material layer and the base member.

In the electronic part-mounted substrate of the present invention, a wiring, which is jointed to a terminal of the electronic part, may be formed on the surface of the insulating material layer. Accordingly, the wiring, which mutually connects the electronic part, is insulated by the insulating material layer. Therefore, it is possible to reliably avoid any short circuit formation of the circuit.

In the electronic part-mounted substrate of the present invention, it is preferable that the thermal conductive member is formed of a metal material. Accordingly, the heat, which is generated by the electronic part, is transmitted more efficiently to the insulating material layer and the base member via the thermal conductive member formed of the metal material having the high coefficient of thermal conductivity.

In the electronic part-mounted substrate of the present invention, at least a part of a contact surface between the thermal conductive member and the insulating material layer is joined with an insulating adhesive. Accordingly, the thermal conductive member and the insulating material layer can be joined to one another even in an area in which the wiring is formed. Therefore, the degree of freedom is enhanced in view of the design.

In the electronic part-mounted substrate of the present invention, the thermal conductive member and the insulating material layer may be joined with a brazing material made of metal in an area in which no wiring is formed for the insulating material layer. Accordingly, the heat is transmitted more efficiently at the joining surface between the thermal conductive member and the insulating material layer. It is possible to dissipate the heat to the outside more efficiently.

The thermal conductive member and the base member may be directly joined with a joining member which penetrates through the insulating material layer. Accordingly, the electronic part can be pressed against the insulating material layer by the thermal conductive member. When the wiring is formed on the insulating material layer, the terminal of the electronic part and the wiring can be allowed to be in conduction by means of the contact without forming any solder joining or the like. The joining member may be a bolt having thermal conductivity.

In the electronic part-mounted substrate of the present invention, the thermal conductive member may have a contact section which makes contact with the electronic part on a side opposite to the insulating material layer, and a leg which extends from the contact section to make contact with the insulating material layer; and the thermal conductive member may be arranged on the surface of the insulating material layer so that the thermal conductive member covers at least a part of the electronic part as viewed in a direction perpendicular to one surface of the substrate. Accordingly, the heat, which is transmitted from the electronic part to the contact section, is reliably transmitted via the leg to the insulating material layer. Therefore, it is possible to dissipate the heat more efficiently to the outside. When the electronic part is completely covered with the thermal conductive member, the electronic part such as IC can be protected by the thermal conductive member from the impact and the impurity such as the dust. Further, when the thermal conductive member is composed of a conductive material such as metal, it is also possible to cut off any electromagnetic wave which would otherwise harmfully affect the electronic part.

In this arrangement, in the electronic part-mounted substrate of the present invention, a surface of the electronic part, which is disposed on the side opposite to the insulating material layer, may be formed to be flat; and the contact section may make contact entirely with the surface of the electronic part disposed on the side opposite to the insulating material layer. Accordingly, the contact area between the thermal conductive member and the electronic part is increased. The heat, which is generated by the electronic part, is reliably transmitted to the thermal conductive member. The heat is further transmitted via the thermal conductive member to the insulating material layer and the substrate. Therefore, the heat, which is generated by the electronic part, can be dissipated to the outside more efficiently.

In this arrangement, in the electronic part-mounted substrate of the present invention, the leg of the thermal conductive member may make contact with an area of the insulating material layer which surrounds an area in which the electronic part is provided. Accordingly, the contact area between the thermal conductive member and the insulating material layer is increased. It is possible to transmit the heat more efficiently from the thermal conductive member to the insulating material layer.

In the electronic part-mounted substrate of the present invention, the leg of the thermal conductive member may be formed to be elastically deformable; and the thermal conductive member may be capable of pressing the electronic part toward the insulating material layer by an elastic force of the leg. Accordingly, the thermal conductive member can be used to press the electronic part against the insulating material layer. Therefore, when the wiring is formed on the insulating material layer, the terminal of the electronic part and the wiring can be allowed to be in conduction by means of the contact without providing any solder joining or the like. Further, the electronic part and the contact section are allowed to reliably make close contact with each other. Therefore, the heat, which is generated by the electronic part, is efficiently transmitted to the thermal conductive member.

The electronic part-mounted substrate of the present invention may further comprise a heat sink which includes a plurality of projecting heat-dissipating sections and which is provided on a surface of a portion of the base member or the insulating material layer disposed closely to the electronic part. Accordingly, the heat, which is transmitted from the electronic part via the thermal conductive member to the insulating material layer and the base member, can be efficiently dissipated by the heat sink to the outside.

In the electronic part-mounted substrate of the present invention, a liquid flow passage, through which a liquid flows, may be formed in the base member. Accordingly, the heat, which is transmitted from the electronic part via the thermal conductive member to the base member, can be transferred by the liquid in the flow passage to a place separated from the electronic part. It is desirable that the liquid flow passage is formed under the leg in order to improve the heat-dissipating performance.

According to a second aspect of the present invention, there is provided a thermal conductive member used for an electronic part-mounted substrate, the substrate including a base member made of metal, and an insulating material layer formed of an insulating ceramic material on one surface of the base member, the insulating material layer having a surface on which a heat-generating electronic part is provided, the thermal conductive member comprising a contact section which makes contact with the electronic part on a side opposite to the insulating material layer, and a leg which extends from the contact section to make contact with the insulating material layer, wherein the thermal conductive member is arranged on the surface of the insulating material layer to cover at least a part of the electronic part.

Accordingly, the heat, which is generated by the electronic part, can be reliably transmitted by the thermal conductive member having the high coefficient of thermal conductivity to the base member composed of the metal material and the insulating material layer composed of the insulating ceramics having the high coefficient of thermal conductivity. In particular, the heat, which is transmitted from the electronic part to the contact section, can be reliably transmitted via the leg to the insulating material layer and the base member. When the thermal conductive member covers the entire electronic part, the thermal conductive member can be used to protect the electronic part such as IC from the impact and the foreign matter such as the dust and cut off the electromagnetic wave as well.

When the electronic part is provided with a casing having a plurality of surfaces, the contact section may be capable of making contact with a flat surface of the plurality of surfaces, the flat surface having the largest areal size among the surfaces. Accordingly, the contact area with respect to the electronic part can be increased without allowing the portion of the thermal conductive member to have any complicated shape, the portion making contact with the electronic part. The heat can be efficiently transmitted from the electronic part by the thermal conductive member.

According to a third aspect of the present invention, there is provided a liquid-jetting head comprising the electronic part-mounted substrate according to the first aspect of the present invention; and a flow passage unit which includes a nozzle which jets a liquid and a pressure chamber communicated with the nozzle; wherein the flow passage unit has a plurality of metal plates which are mutually stacked to form a liquid flow passage including the pressure chamber; the base member made of metal is provided on one surface of the flow passage unit to cover the pressure chamber, the insulating material layer being formed of the insulating ceramic material on a surface of the base member made of metal on a side opposite to the flow passage unit; the insulating material layer and the base member made of metal function as an actuator which changes a volume of the pressure chamber; and the electronic part is a driving unit which drives the actuator. The base member made of metal may be a vibration plate.

Accordingly, the heat, which is generated by the driving unit, is transmitted from the thermal conductive member to the insulating material layer composed of the ceramics. Further, the heat is transmitted to the base member made of metal (vibration plate) and the plurality of metal plates of the flow passage unit. Therefore, the heat can be efficiently dissipated to the outside via the vibration plate made of metal and the plurality of metal plates of the flow passage unit.

In the liquid-jetting head of the present invention, a liquid flow passage, through which the liquid flows, may be formed in the metal plates. Accordingly, the heat, which is transmitted to the plates made of metal, can be transferred by the liquid contained in the flow passage to the position separated from the driving unit.

In this arrangement, when the liquid, which is allowed to flow through the liquid flow passage, is an ink, it is possible to provide an ink-jet head which is excellent in the heat-dissipating performance.

BRIEF DESCRIPTION OF THE DRAWINGS

FIGS. 3A and 3B show sectional views in relation to FIG. 2, wherein FIG. 3A shows a sectional view taken along a line IIIA-IIIA, and FIG. 3B shows a sectional view taken along a line IIIB-IIIB.

DESCRIPTION OF THE PREFERRED EMBODIMENTS

Preferred embodiments of the present invention will be explained below with reference to the drawings.

First Embodiment

A first embodiment is illustrative of a case in which the present invention is applied to an electronic part-mounted substrate to be used for the electronic equipment such as mobile phones and personal computers.

Figure 1:
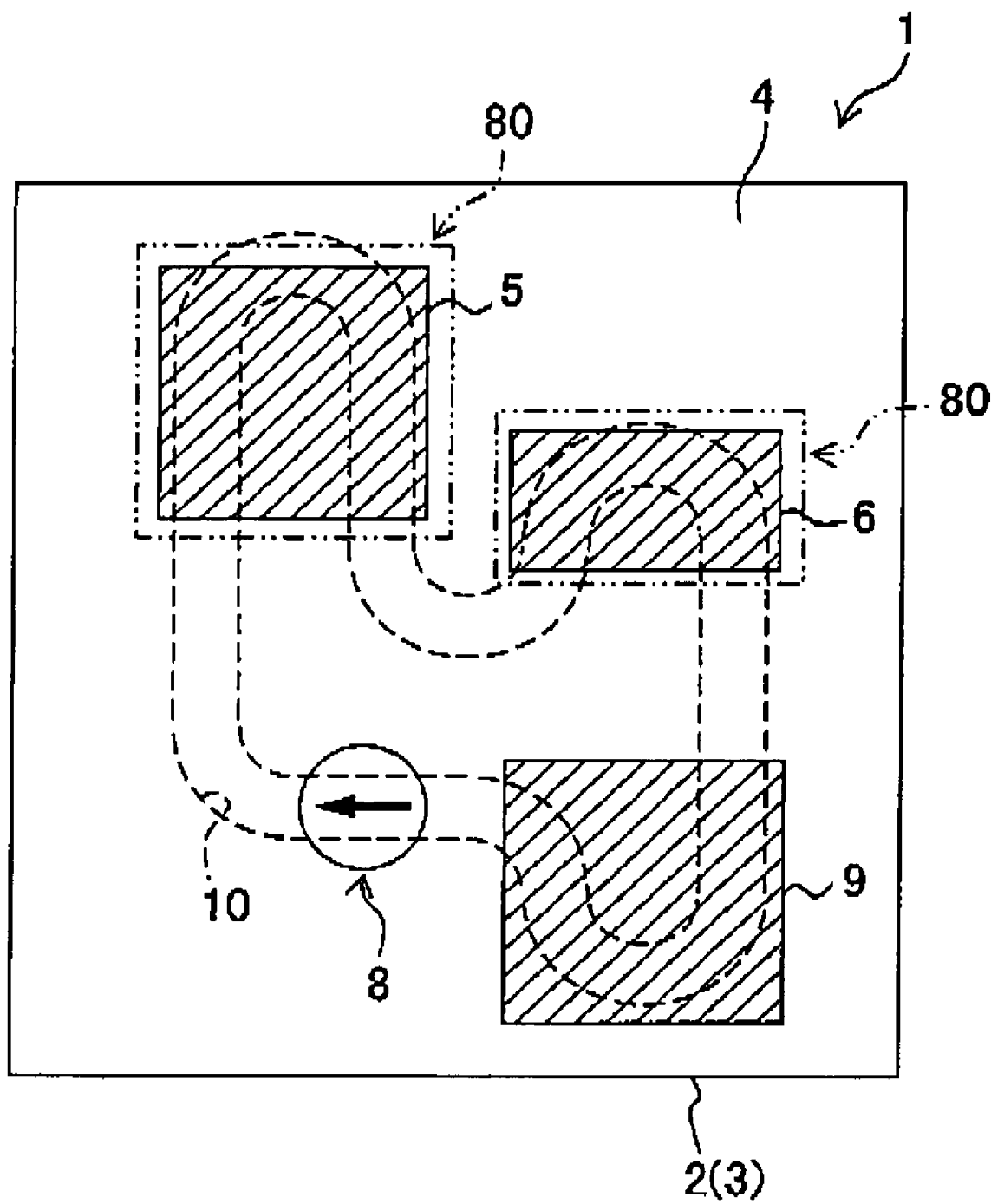
FIG. 1 shows a schematic plan view illustrating an electronic part-mounted substrate according to an embodiment of the present invention.
Figure 2:
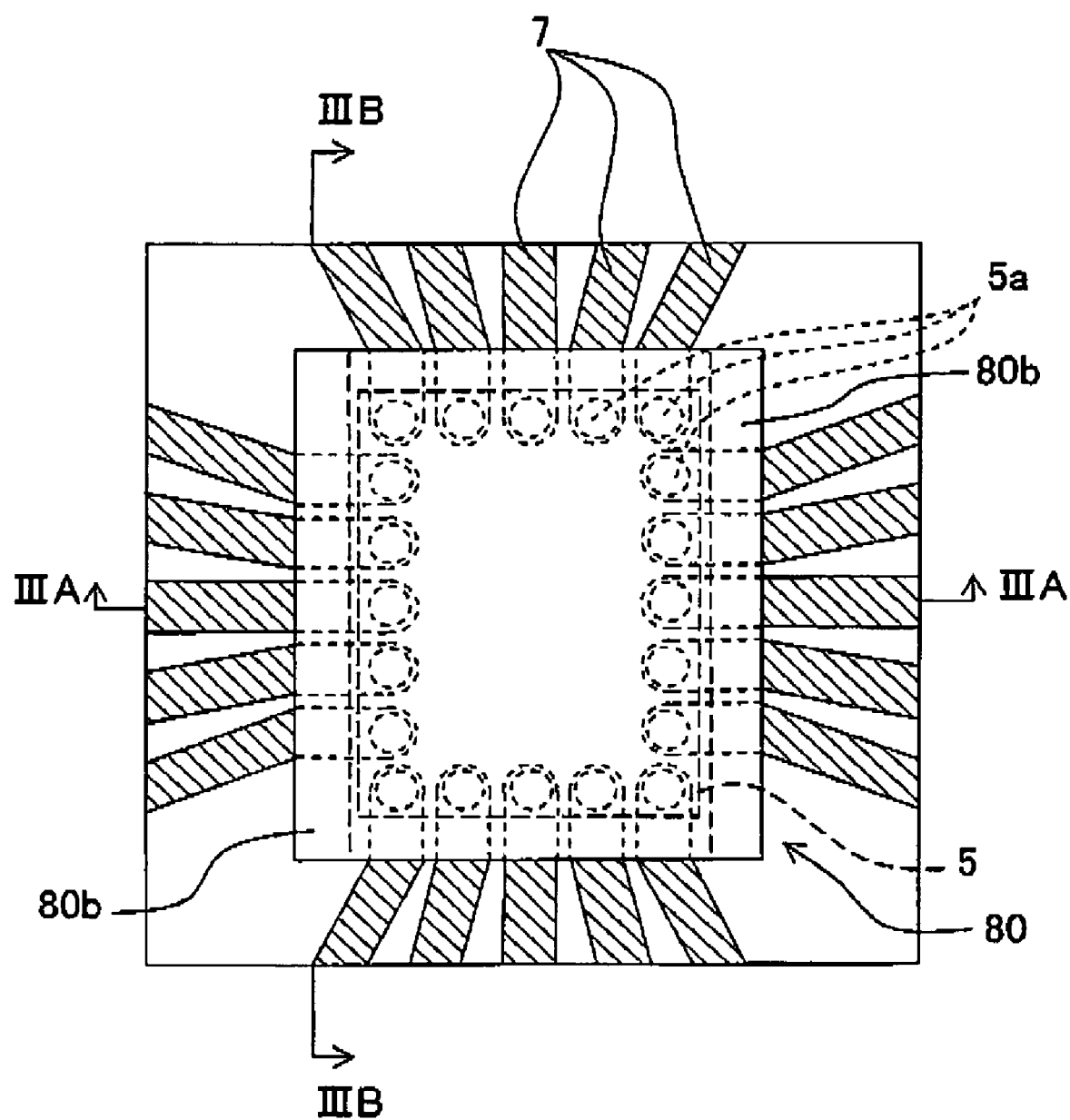
FIG. 2 shows a magnified view illustrating a portion disposed around IC shown in FIG. 1.
Figure 3A:
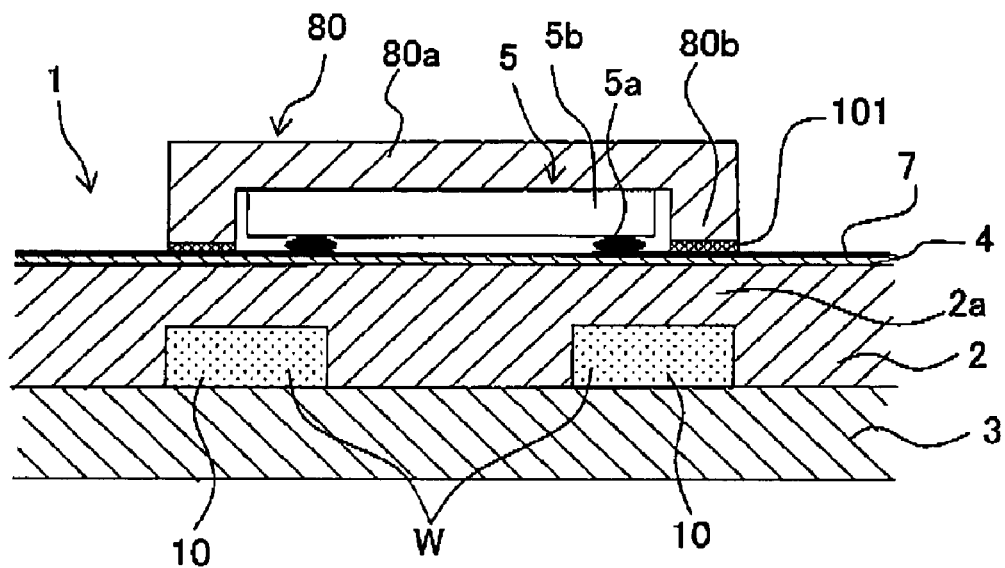
Figure 3B:
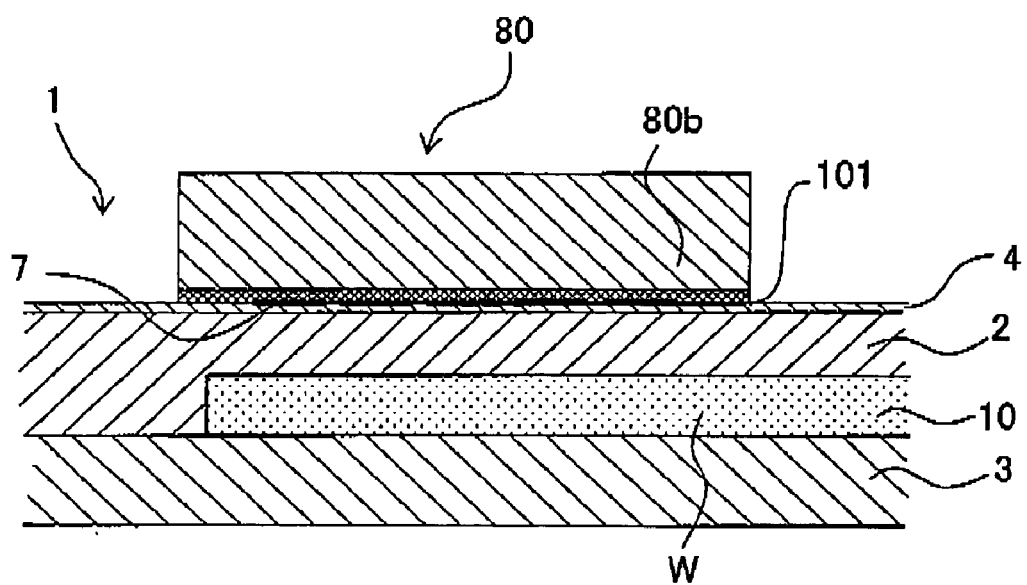

FIG. 1 shows a schematic plan view illustrating an electronic part-mounted substrate (module) 1 according to a first embodiment, FIG. 2 shows a magnified view illustrating those disposed around IC 5 mounted on the electronic part-mounted substrate 1 shown in FIG. 1, FIG. 3A shows a sectional view taken along a line IIIA-IIIA shown in FIG. 2, and FIG. 3B shows a sectional view taken along a line IIIB-IIIB shown in FIG. 2. The surface, which is disposed on the side in front of the sheet surface of FIG. 1, is defined as "upper surface". As shown in FIGS. 1 to 3A and 3B, the electronic part-mounted substrate 1 (hereinafter simply referred to as "substrate 1") includes two metal plates 2, 3 which serve as a base member, an insulating material layer 4 which is formed on the upper surface of the upper plate 2, two thermal conductive members 80 which make contact with the upper surface of the insulating material layer 4, IC's 5, 6, and the upper surfaces of IC's 5, 6 respectively, a flow passage 10 which is formed in the plates 2, 3, and a heat sink or heat-dissipating unit 9 which is provided on the upper surface of the insulating material layer 4.

Each of the two plates 2, 3 is formed of a metal material having a high coefficient of thermal conductivity, including, for example, stainless steel, iron, copper, nickel, and aluminum. The insulating material layer 4, which is formed on the upper surface of the upper plate 2, is an extremely thin film (for example, about 0.5 to 10 µm) composed of a ceramic material having a high coefficient of thermal conductivity, including, for example, alumina, aluminum nitride, silicon carbide, silicon nitride, mullite, and zirconia. The insulating material layer 4 can be formed to be an extremely thin layer by using, for example, the aerosol deposition method (AD method) in which an ultra-fine particulate material is deposited by being collided at a high speed against the surface on which the layer is to be formed. Alternatively, the thin insulating material layer 4 can be also formed by using the sol-gel method, the sputtering method, or the CVD (chemical vapor deposition) method.

A large number of electronic parts, which include, for example, IC's 5, 6, resistors (not shown), and capacitors (not shown), are mounted on the upper surface of the insulating material layer 4 by the aid of terminals. A plurality of wirings 7, which are joined to the terminals (for example, the terminals 5a) of IC's 5, 6 or the like to electrically connect the electronic parts to one another, are also formed on the upper surface of the insulating material layer 4. Therefore, the plurality of wirings 7 are insulated from each other by the insulating material layer 4 to avoid the formation of any short circuit. In this arrangement, the terminals (for example, the terminals 5a) of the electronic parts such as IC's 5, 6 are electrically connected to the wirings 7, for example, by the solder or the like. A part of the heat generated by IC 5 or the like is transmitted to the insulating material layer 4 via the terminals 5a. IC 5 has a block-shaped package 5b (casing). The upper surface of the package 5b is formed to be a flat surface which is parallel to the insulating material layer 4. The upper surface has the largest areal size of those of the five surfaces for forming the surface of the package 5b. The package 5b is formed of plastic or ceramics. The IC 5 may be a bare chip having no package such as a silicon substrate.

As shown in FIGS. 2 and 3A and 3D, the two thermal conductive members 80, each of which is composed of a metal material having a high coefficient of thermal conductivity (for example, copper or aluminum), are provided on the upper surface of the insulating material layer 4 so that IC's 5, 6 are entirely covered therewith. The two thermal conductive members 80 are constructed equivalently. Therefore, the following explanation will be made about the thermal conductive member 80 which covers IC 5. The thermal conductive member 80 has a flat plate-shaped contact section 80a which is parallel to the upper surface of the package 5b of IC 5, and two legs 80b which extend downwardly from the contact section 80a.

The flat plate-shaped contact section 80a is rectangular as viewed in a plan view. The flat plate-shaped contact section 80a entirely covers the upper surface of the package 5b of IC 5, and the contact section 80a makes contact with the upper surface of the IC 5 while being disposed at the upper position. Therefore, the heat generated by IC 5 is reliably transmitted to the contact section 80a. The contact section 80a makes contact with the upper surface having the largest areal size of those of the surfaces for forming the surface of the package 5b. Therefore, even when the contact section 80a has the simple planar (flat) shape, then the contact area can be maximally secured with respect to IC 5, and it is possible to efficiently transfer the heat to the thermal conductive member 80.

The two legs 80b extend downwardly from opposing two sides (both of left and right side portions shown in FIG. 2) of the rectangular contact section 80a respectively. The two legs 80b are adhered to the insulating material layer 4 by the aid of an adhesive 101. Accordingly, the heat, which is transmitted from IC 5 to the contact section 80a, is further transmitted via the two legs 80b to the insulating material layer 4. Therefore, the thermal conductive member 80 makes it possible to reliably transmit, to the insulating material layer 4, the greater part of the heat generated by IC 5.

As shown in FIG. 2, the plurality of wirings 7 are formed in the areas which overlap the two legs 80b on the upper surface of the insulating material layer 4 in this embodiment. Accordingly, in order to join the legs 80b and the insulating material layer 4 while avoiding the formation of any short circuit between the plurality of wirings 7, it is preferable to use the adhesive 101 which is composed of, for example, synthetic resin and which has the insulating property. When the insulative adhesive 101 is used as described above, the legs 80b can be joined to the insulating material layer 4 even at the portion of the upper surface of the insulating material layer 4 on which the wirings 7 are formed. Therefore, the allowable range of the joining position between the thermal conductive member 80 and the insulating material layer 4 is widened as compared with a case in which the joining is made while making the legs 80 to avoid the wirings 7. Thus, the degree of freedom is improved in the design. In general, the coefficient of thermal conductivity of the insulative adhesive such as the synthetic resin is often smaller than those of the ceramic material and the metal material. Therefore, it is preferable that the thickness of the adhesive 101 is as thin as possible within a range in which the sufficient joining strength is obtained.

The thermal conductive member 80 is arranged to cover IC 5. Therefore, IC 5 is protected by the thermal conductive member 80 from the shock or impact and the foreign matter such as the dust. Further, the electromagnetic wave, which harmfully affects IC 5, is shielded or cut off to some extent by the thermal conductive member 80 made of metal.

Table 1 shows the coefficients of thermal conductivity of the metal materials for constructing the plates 2, 3 and the thermal conductive member 80, the coefficients of thermal conductivity of the ceramic materials for constructing the insulating material layer 4, and the coefficient of thermal conductivity of the epoxy resin having been hitherto generally used as the resin material with which the surface of the substrate such as glass cloth is impregnated.

TABLE 1

| Name of material | Coefficient of thermal conductivity (W/m · k) |
| --- | --- |
| (Metal material) | |
| Stainless steel | 20 |
| Iron | 84 |
| Copper | 403 |
| Nickel | 94 |
| Aluminum | 240 |
| (Ceramic material) | |
| Alumina | 20-34 |
| Aluminum nitride | 170 |
| Silicon carbide | 75 |
| Silicon nitride | 16-21 |
| Mullite | 6 |
| Zirconia | 2-4 |
| Epoxy resin | 0.19 |

As shown in Table 1, the coefficients of thermal conductivity of the metal materials and the ceramic materials have the values which are several tens times to several hundreds times the coefficient of thermal conductivity of the epoxy resin to be used for the conventional glass epoxy substrate. Therefore, unlike the glass epoxy substrate, the greater part of the heat generated by IC 5 is efficiently transmitted via the thermal conductive member 80 made of metal having the high coefficient of thermal conductivity to the metal plates 2, 3 and the insulating material layer 4 composed of the ceramic material having the high coefficient of thermal conductivity. The heat is transmitted to the plates 2, 3, and the heat is dissipated to the outside. In general, the ceramic material is more expensive than the metal material. Further, the coefficient of thermal conductivity of the ceramic material is lower than the coefficient of thermal conductivity of the metal material in many cases. Therefore, in order to obtain the substrate which is cheap and which is satisfactory in the dissipating efficiency of the heat, it is preferable that the thickness of the insulating material layer 4 composed of the ceramic material is sufficiently thinner than those of the plates 2, 3 composed of the metal material. As the thermal conductive member 80, stainless steel, copper or aluminum is preferable, and aluminum is particularly preferable.

As shown in FIGS. 1 and 3, a groove, which forms a closed loop-shaped flow passage 10 (liquid flow passage), is formed in the two plates 2, 3. The groove is formed, for example, on the lower surface of the upper plate 2 by means of the half etching. The flow passage 10, which is formed in the groove, is filled with water W (liquid). The water W is pressurized by a pressurizing mechanism 8 as described later on, and the water W is circulated in the closed loop-shaped flow passage 10. The flow passage 10 is formed to pass through the area in which IC 5 which generates the large amount of heat is arranged. As shown in FIG. 3A, the flow passage 10 is formed to have a rectangular cross section in the two plates 2, 3. A thin-walled section 2a of the upper plate 2 intervenes between the flow passage 10 and the insulating material layer 4. The metal material layer (thin-walled section 2a), which has a large strength, exists under the insulating material layer which is composed of the ceramic material having a small strength as compared with the metal plates 2, 3, in the portion in which the flow passage 10 is formed as described above. Therefore, the substrate 1 is suppressed from the decrease in the strength at the portion in which the flow passage 10 is formed.

Further, as shown in FIG. 1, those provided at intermediate positions of the flow passage 10 include the pressurizing mechanism 8 which pressurizes the water W in the flow passage 10 to forcibly circulate the water W, and the heat sink 9 which dissipates, to the outside, the heat transmitted from IC 5 to the water W.

Figure 4:
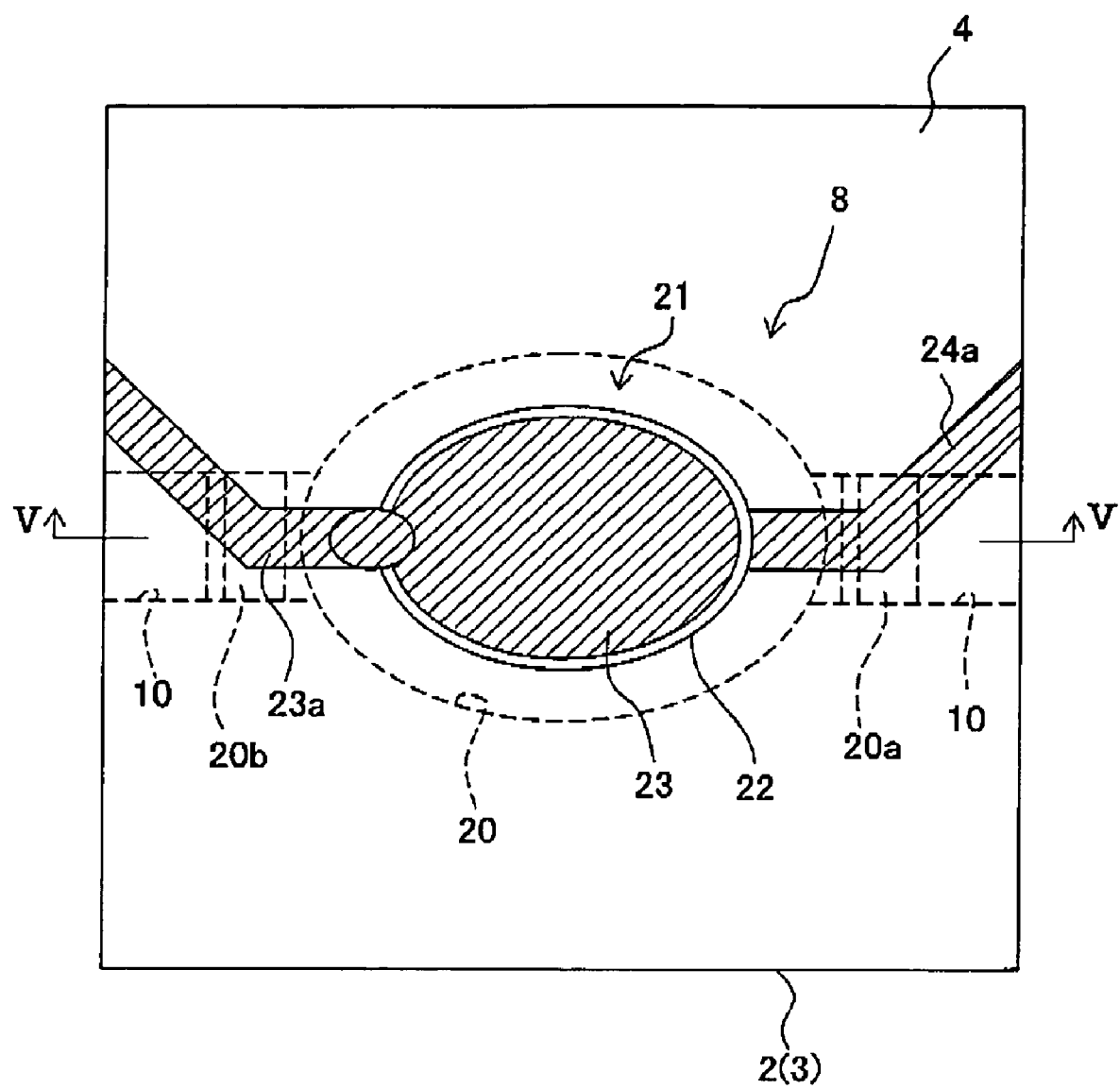
FIG. 4 shows a magnified view illustrating a portion disposed around a pressurizing chamber shown in FIG. 1.
Figure 5:
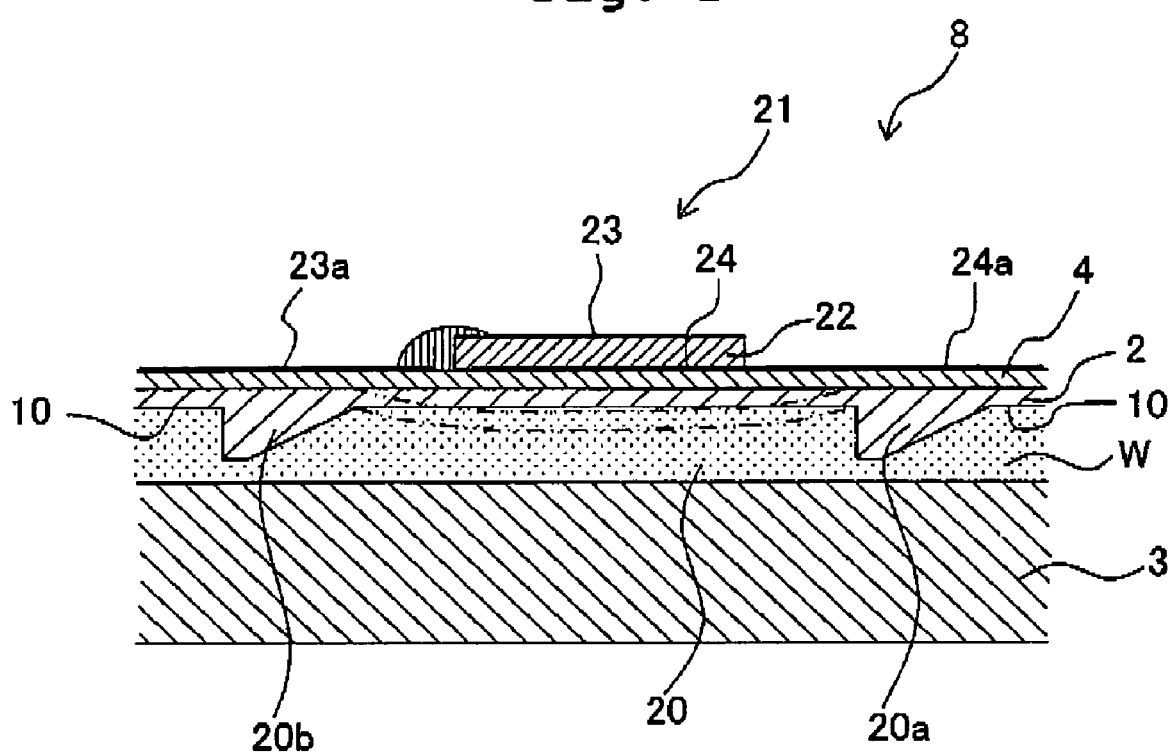
FIG. 5 shows a sectional view taken along a line V-V shown in FIG. 4.

FIG. 4 shows a magnified view illustrating a portion disposed around the pressurizing mechanism 8, and FIG. 5 shows a sectional view taken along a line v-v shown in FIG. 4. As shown in FIGS. 4 and 5, the pressurizing mechanism 8 has a pressurizing chamber 20 which is formed at an intermediate position of the flow passage 10, and a piezoelectric actuator 21 which is arranged over the pressurizing chamber 20 and which changes the volume of the pressurizing chamber 20. As shown in FIG. 4, the pressurizing chamber 20 has a width which is wider than those of the other portions of the flow passage 10. The water W, which is circulated in the flow passage 10, is flowed into the pressurizing chamber 20 from the right side in FIGS. 4 and 5, and the water W is pressurized in the pressurizing chamber 20, followed by being fed to the left side as shown in FIGS. 4 and 5. Two projections 20a, 20b, which protrude downwardly from the ceiling surface of the flow passage 10, are formed at connecting portions between the pressurizing chamber 20 and the flow passage 10 disposed on the upstream side from the pressurizing chamber 20 (right side in FIGS. 4 and 5) and between the pressurizing chamber 20 and the flow passage 10 disposed on the downstream side (left side in FIGS. 4 and 5) respectively. Each of the two projections 20a, 20b has a substantially right-angled triangular cross-sectional shape such that the projections 20a, 20b vertically protrude most extensively on the downstream side of the flow passage 10 respectively and the projections are gradually inclined upwardly at portions as the portions are disposed toward the upstream side of the flow passage 10 from the most extensively protruding portions. Therefore, the flow passage resistance, which is obtained when the water flows from the upstream side to the downstream side of the flow passage, is smaller than the flow passage resistance which is obtained when the water flows from the downstream side to the upstream side of the flow passage 10, at the portions at which the projections 20a, 20b are formed. The water W is regulated so that the water W flows from the upstream side to the downstream side. Therefore, the heat is transferred by the water W continuously and smoothly, because any counterflow, which is directed from the downstream side to the upstream side, is avoided. Alternatively, the direction, in which the water W flows, may be regulated by providing a valve in place of the projections 20a, 20b.

The piezoelectric actuator 21 includes an electrode 24 which is formed at a position opposed to the pressurizing chamber 20 on the upper surface of the insulating material layer 4, a piezoelectric layer 22 which is formed on the surface of the electrode 24, and an electrode 23 which is formed on the surface of the piezoelectric layer 22 on the side opposite to the electrode 24. The piezoelectric layer 22 is composed of a major component of ferroelectric lead titanate zirconate (PZT). The electrode 23, which is disposed on the upper side of the piezoelectric layer 22, is grounded via a wiring 23a. On the other hand, the electrode 24, which is disposed on the lower side of the piezoelectric layer 22, is connected to IC 5 via a wiring 24a. The driving pulse signal is supplied from IC 5 to the electrode 24 disposed on the lower side of the piezoelectric layer 22 to apply a predetermined voltage to the electrode 24 at every certain period of time. When the predetermined voltage is applied from IC 5 to the electrode 24 disposed on the lower side, then the electric field in the thickness direction is applied to the piezoelectric layer 22 interposed between the two electrodes 23, 24, and the piezoelectric layer 22 contracts in the horizontal direction perpendicular to the direction of polarization. The portions of the plate 2 and the insulating material layer 4, which cover the upper part of the pressurizing chamber 20, are deformed in accordance with the contraction of the piezoelectric layer 22 so as to project toward the pressurizing chamber 22, and thus the volume of the pressurizing chamber 20 is decreased. Therefore, the water W contained in the pressurizing chamber 20 is pressurized, and the water W is fed to the flow passage 10 disposed on the downstream side.

Figure 6:
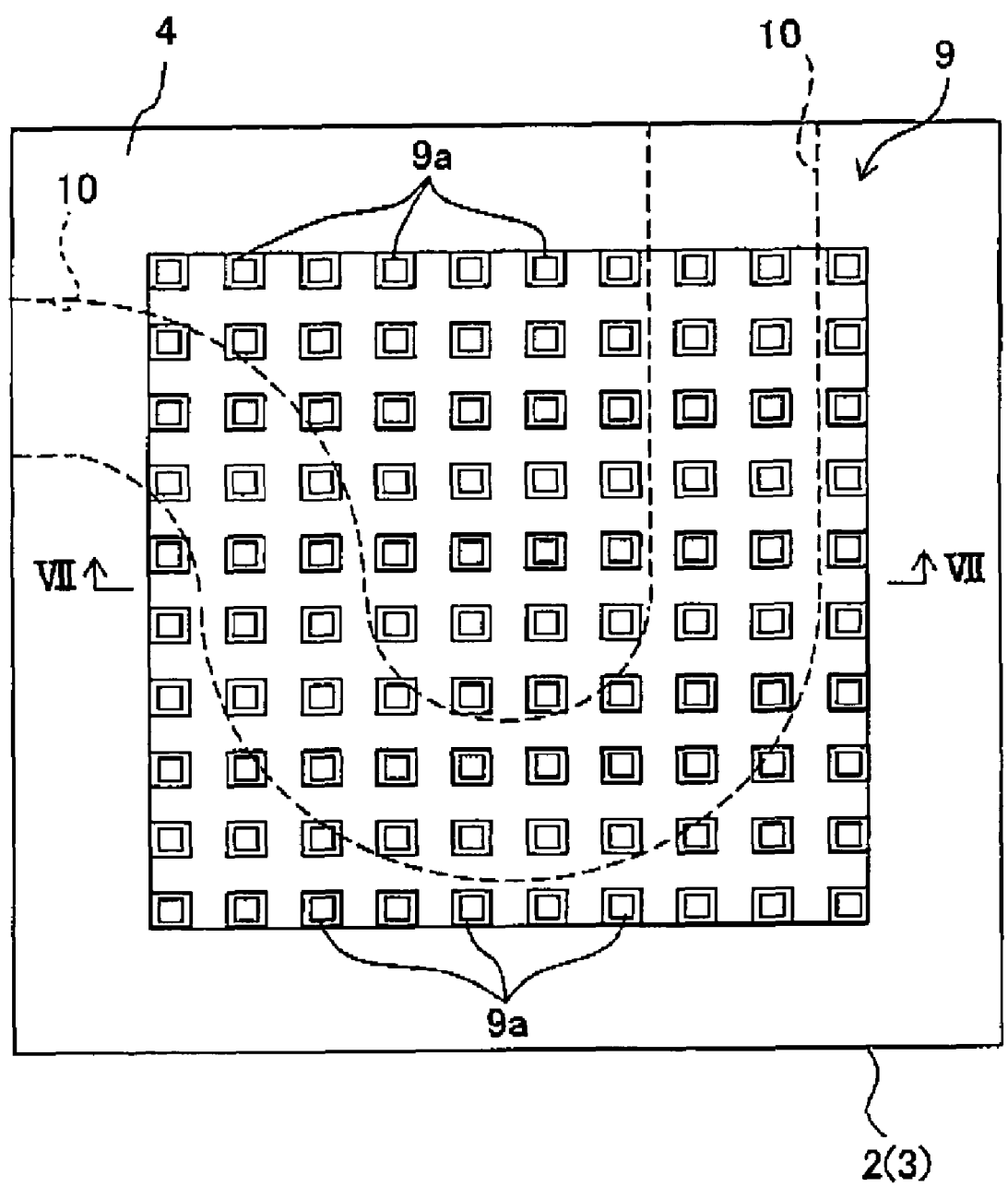
FIG. 6 shows a magnified view illustrating a portion disposed around a heat sink shown in FIG. 1.
Figure 7:
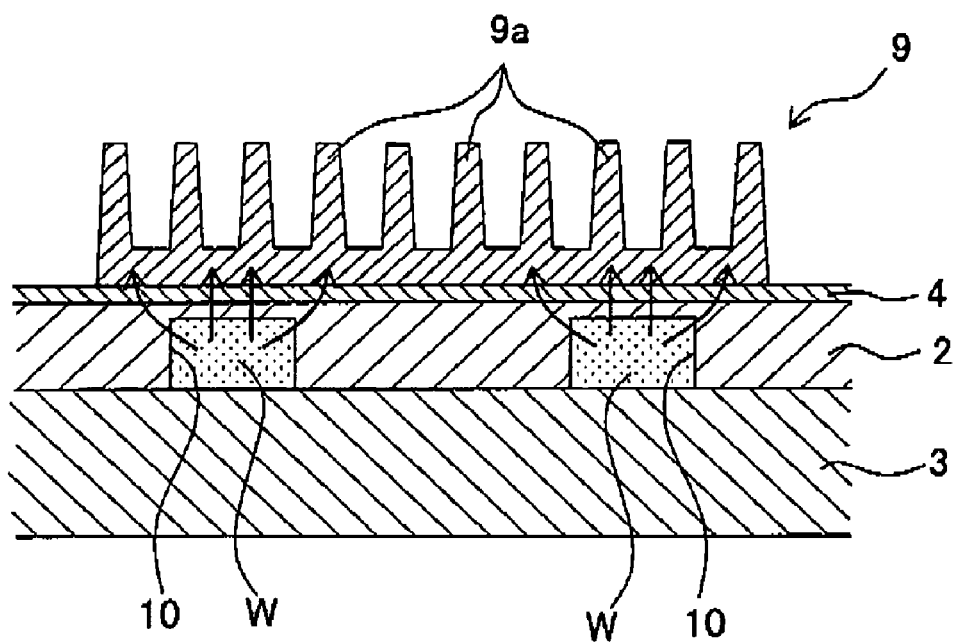
FIG. 7 shows a sectional view taken along a line VII-VII shown in FIG. 6.

FIG. 6 shows a magnified view illustrating a portion disposed around the heat sink 9, and FIG. 7 shows a sectional view taken along a line VII-VII shown in FIG. 6. As shown in FIG. 1, the flow passage 10 passes under the heat sink 9. The heat sink 9 is composed of a metal material having the satisfactory thermal conductivity, and it has a large number of heat-dissipating sections 9a which protrude upwardly. The heat, which is transferred by the water W circulating in the flow passage 10, is transmitted to the heat sink 9 via the plate 2 and the insulating material layer 4. The heat is dissipated to the outside from the large number of heat-dissipating sections 9a. In FIG. 7, the heat sink 9 is provided on the insulating material layer 4 of the surface of the plate 2 disposed on the upper side. Alternatively, the heat sink 9 may be provided on the lower surface of the plate 3 disposed on the lower side.

According to the substrate 1 of the first embodiment described above, the following effect is obtained.

The heat generated by IC 5 is transmitted via terminals 5a to the insulating material layer 4 and the metal plates 2, 3, because the substrate 1 has the metal plates 2, 3 which serve as the base members, and has the insulating material layer 4, on which IC 5 is provided, on the surface of the plate 2. Further, the substrate 1 is provided with the thermal conductive member 80 made of metal which makes contact with both of IC 5 and the insulating material layer 4. Therefore, the heat generated by IC 5 is reliably transmitted to the insulating material layer 4 and the plates 2, 3 made of metal via the thermal conductive member 80. The heat is efficiently dissipated to the outside.

The closed loop-shaped flow passage 10, through which the water W flows, is formed in the plates 2, 3. Therefore, the heat, which is transmitted from IC 5 to the thermal conductive member 80 and the insulating material layer 4, is reliably transferred to the position separated from IC 5 by the water W circulating in the flow passage 10. Further, the heat sink 9 is provided on the upper surface of the insulating material layer 4. Therefore, the heat, which is transferred by the water W contained in the flow passage 10, is dissipated to the outside more reliably by the heat sink 9.

Next, an explanation will be made about modified embodiments in which the first embodiment is variously modified. However, those constructed in the same manner as in the first embodiment are designated by the same reference numerals, any explanation of which will be appropriately omitted.

First Modified Embodiment

Figure 8:
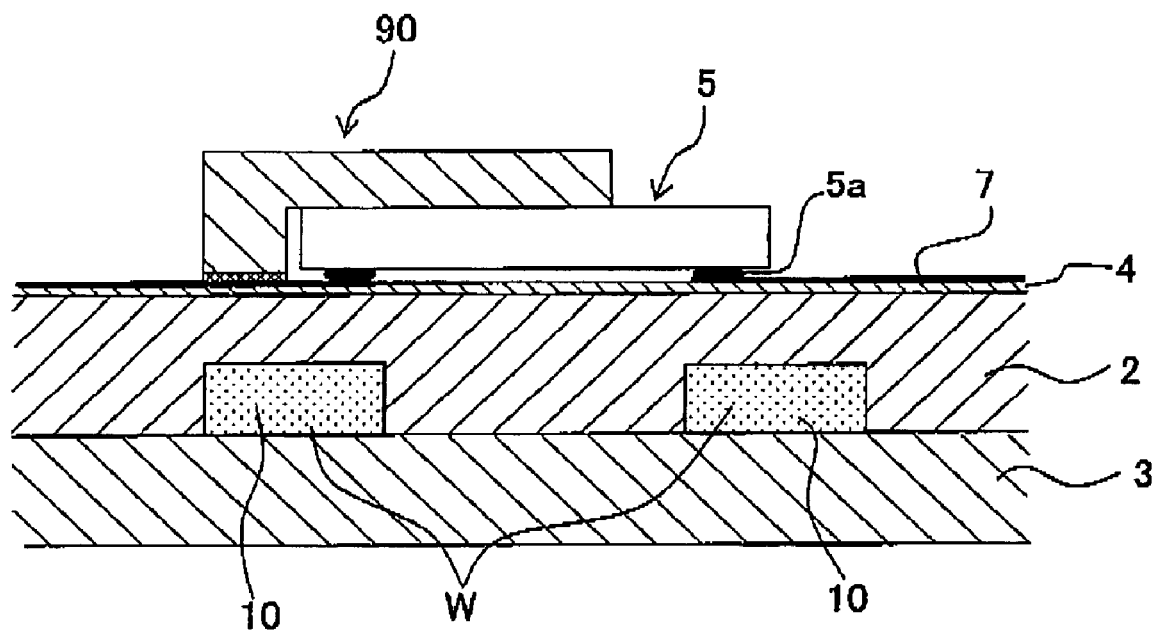
FIG. 8 shows a sectional view illustrating a first modified embodiment corresponding to FIG. 3A.
Figure 9:
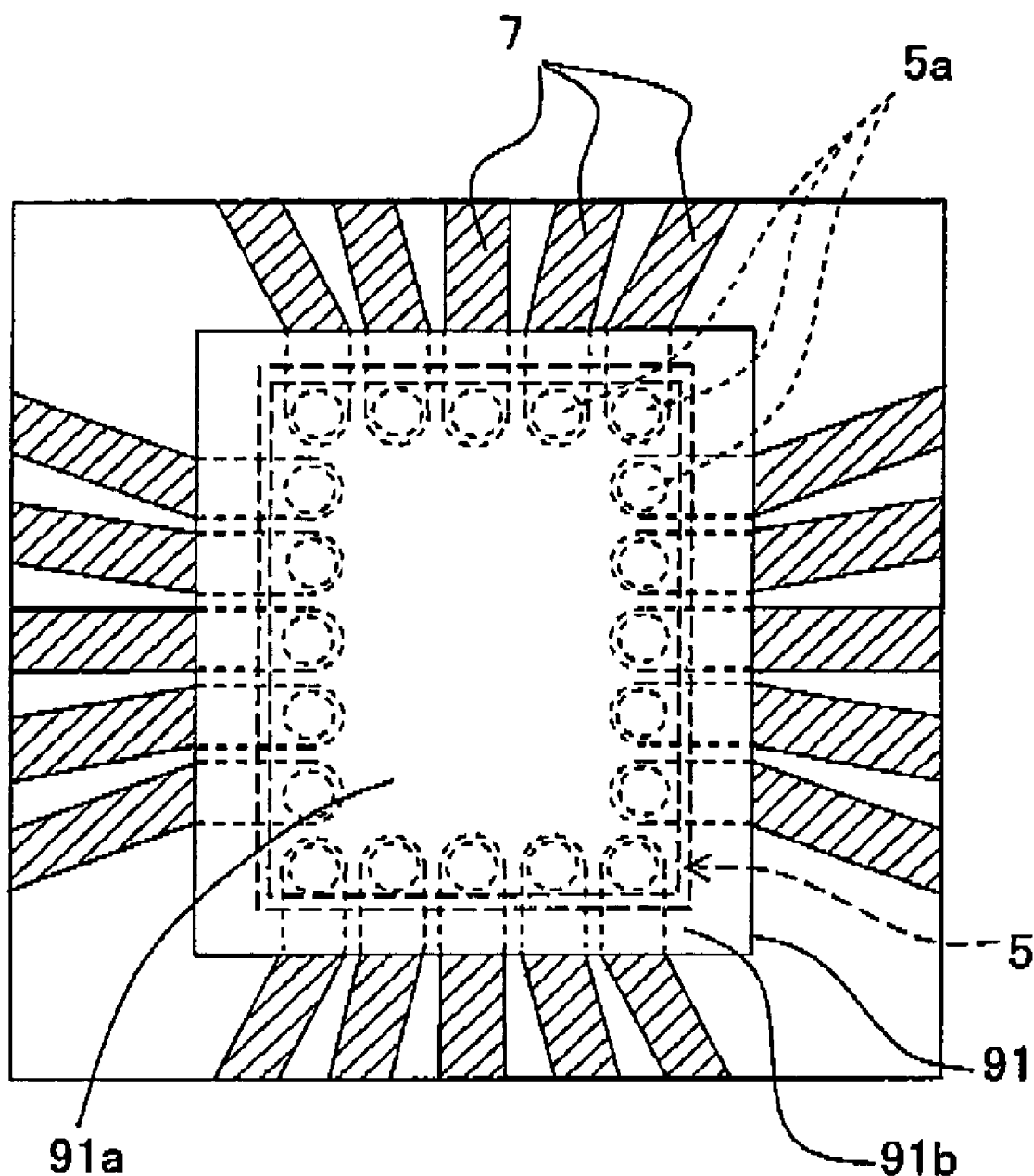
FIG. 9 shows a plan view illustrating a second modified embodiment corresponding to FIG. 2.

As shown in FIG. 8, a thermal conductive member 90 may be arranged on the insulating material layer 4 so that only a part of the upper surface of IC 5 is covered therewith. Also in this case, the heat generated by IC 5 is reliably transmitted to the insulating material layer 4 and the plates 2, 3 via the thermal conductive member 90, Second Modified Embodiment As shown in FIG. 9, the following arrangement is also available. That is, a thermal conductive member 91 has legs 91b which extend downwardly from four sides of a rectangular contact section 91a respectively so as to define a square wall which surrounds the IC 5. The legs 91b are joined to the insulating material layer 4 in an area to surround IC 5. The entire IC 5 may be completely covered with the thermal conductive member 91. In this arrangement, the contact area between the legs 91b and the insulating material layer 4 is increased. Therefore, the heat, which is transmitted from IC 5 to the thermal conductive member 91, is efficiently transmitted to the insulating material layer 4 and the plates 2, 3. Further, IC 5 is completely covered with the thermal conductive member 91. Therefore, IC 5 can be reliably protected by the thermal conductive member 91 from the shock or impact and the foreign matter such as the dust. Further, it is also possible to enhance the effect to shield or cut off the electromagnetic wave.

Third Modified Embodiment

Figure 10:
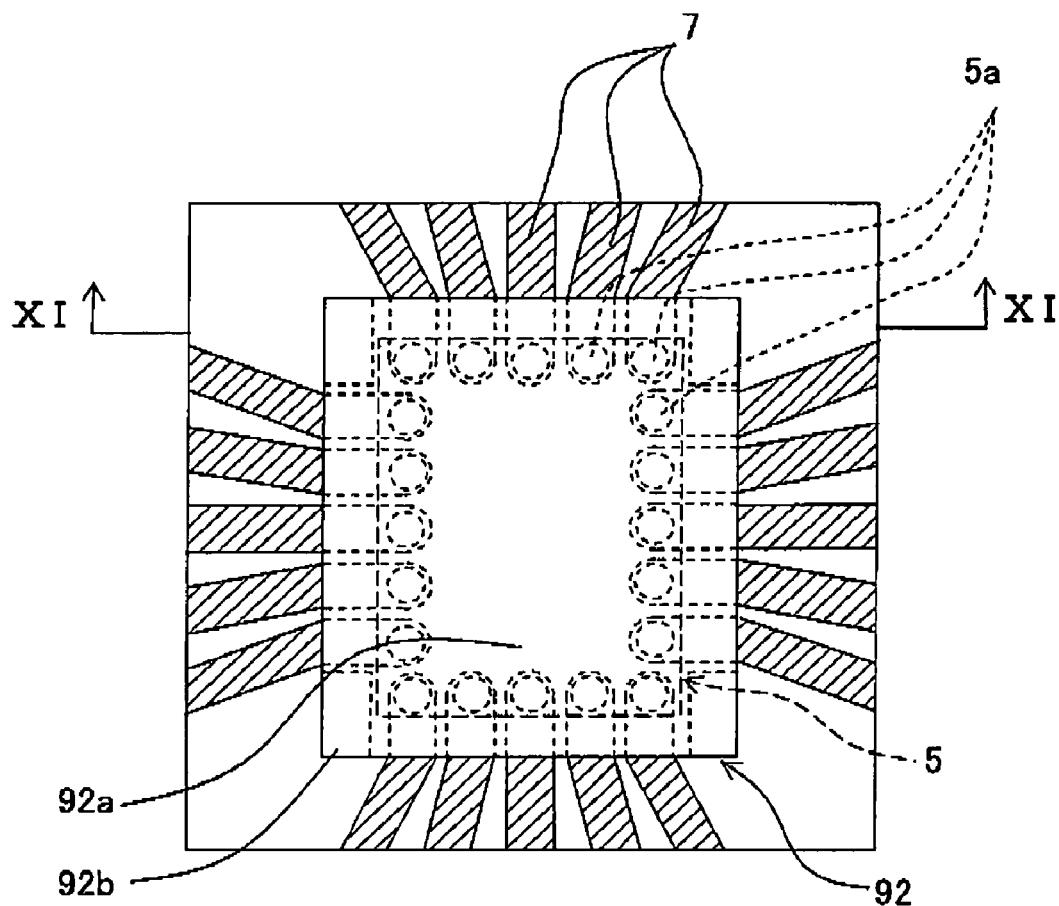
FIG. 10 shows a plan view illustrating a third modified embodiment corresponding to FIG. 2.
Figure 11:
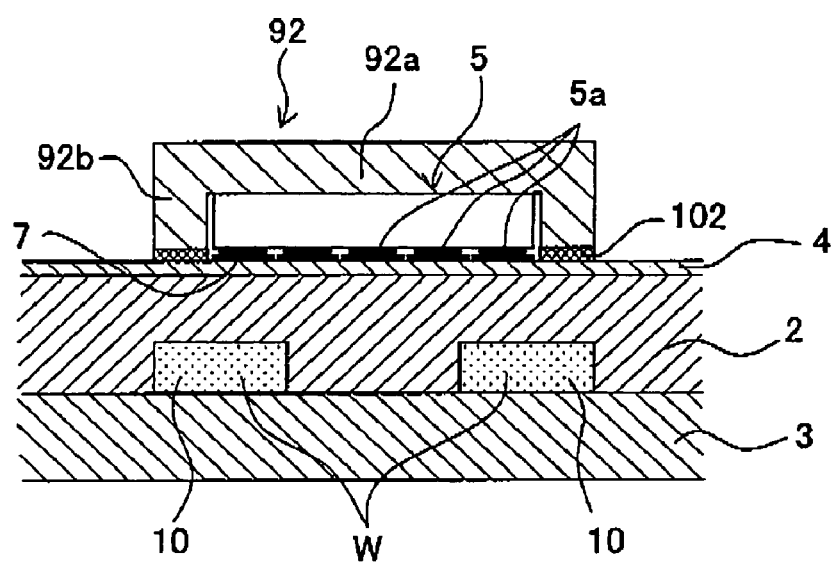
FIG. 11 shows a sectional view taken along a line XI-XI shown in FIG. 10.

The legs of the thermal conductive member and the insulating material layer 4 may be joined to one another by a metal brazing material having a satisfactory coefficient of thermal conductivity in the area in which the wiring 7 is not formed on the upper surface of the insulating material layer 4. For example, as shown in FIGS. 10 and 11, the thermal conductive member 92 may have a contact section 92a which makes contact with the upper surface of IC 5, and four legs 92b which extend downwardly from four corner portions of the contact section 92a as viewed in a plan view. FIG. 11 shows a sectional view taken along a line XI-XI shown in FIG. 10. In this arrangement, the heat is transmitted more easily from the legs 92b to the insulating material layer 4.

Fourth Modified Embodiment

Figure 12:
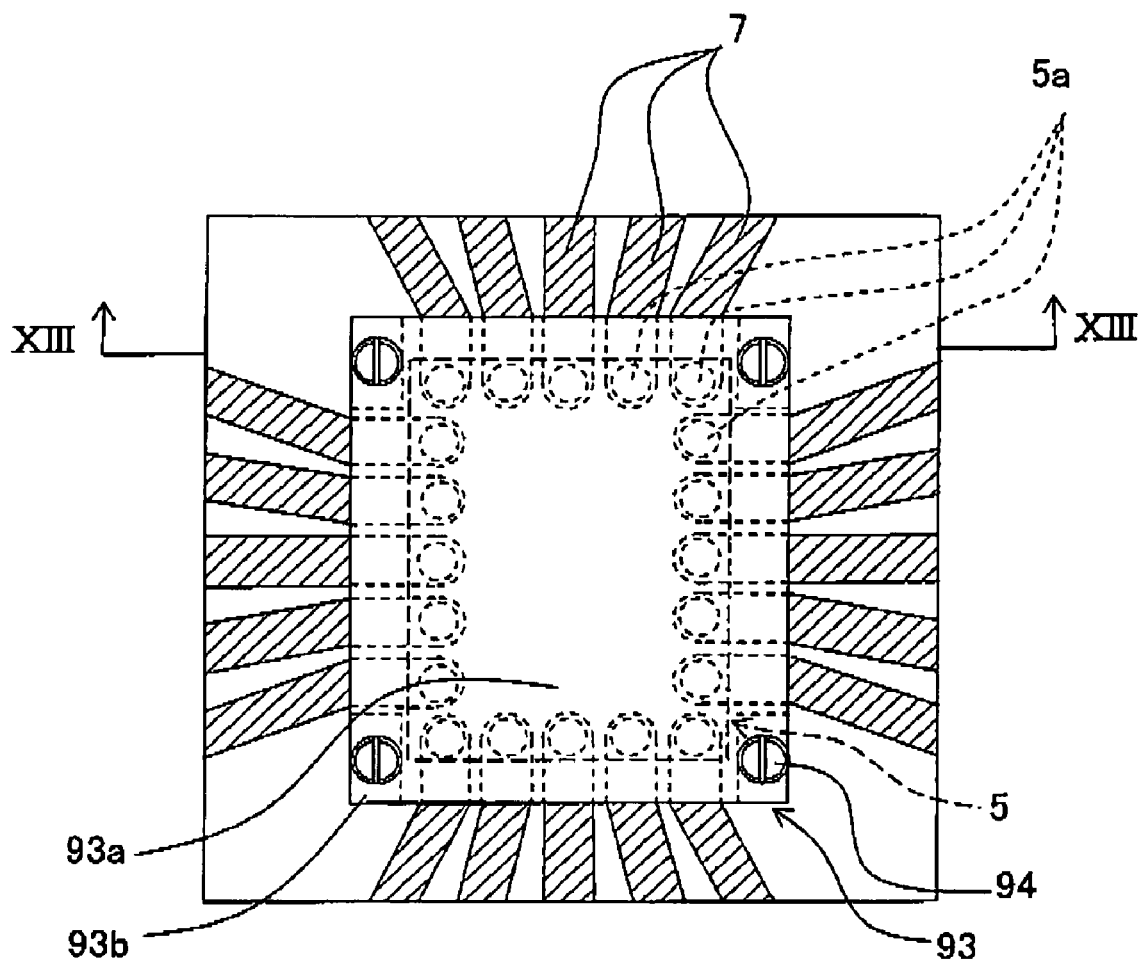
FIG. 12 shows a plan view illustrating a fourth modified embodiment corresponding to FIG. 2.
Figure 13:
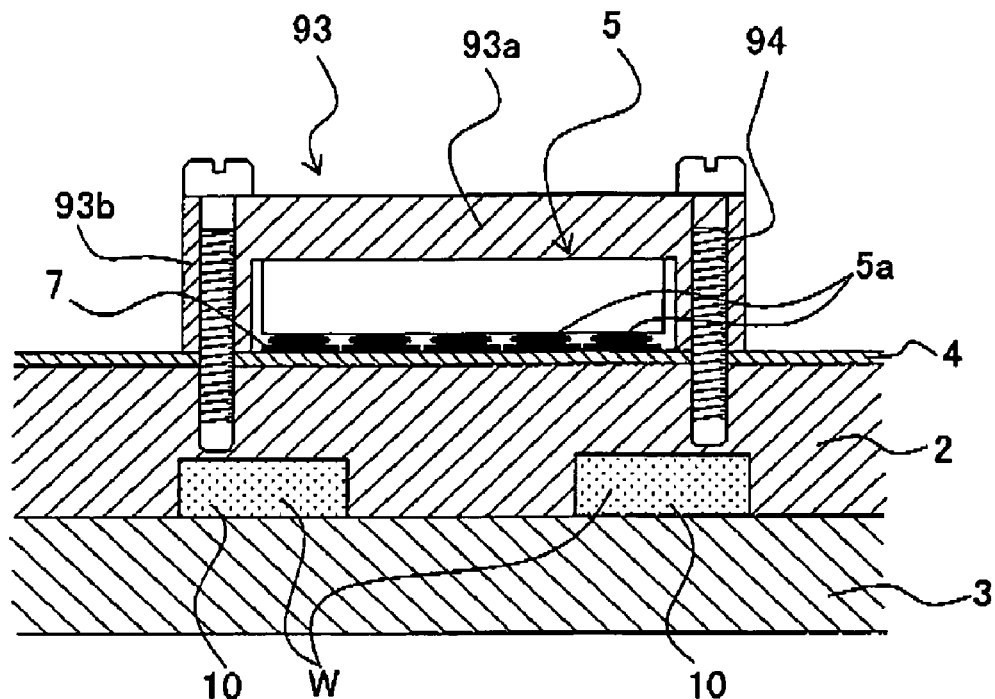
FIG. 13 shows a sectional view taken along a line XIII-XIII shown in FIG. 11.

As shown in FIGS. 12 and 13, legs 93b of a thermal conductive member 93 may be provided at portions (for example, four corner portions of a contact section 93a as viewed in a plan view) at which no wiring 7 is formed. The legs 93b and the plate 2 may be joined to one another by joint members such as bolts 94 made of metal which penetrate through the insulating material layer 4. FIG. 13 shows a sectional view taken along a line XIII-XIII shown in FIG. 12. In this arrangement, the thermal conductive member 93 presses IC 5 in the direction toward the insulating material layer. Therefore, the terminal 5a and the wiring 7 can be directly joined to one another without using any solder or the like. Further, the thermal conductive member 93 and the plate 2 are directly joined to one another by the bolts 94 made of metal. Therefore, the heat generated by IC 5 can be directly transmitted to the plates 2, 3 via the thermal conductive member 93 and the bolts 94 made of metal, not through the insulating material layer 4 which has the coefficient of thermal conductivity lower than those of the metal plates 2, 3. The joint member is not limited to the shape of the bolt 94, and may be a screw, a nail, or a pin.

Fifth Modified Embodiment

Figure 14:
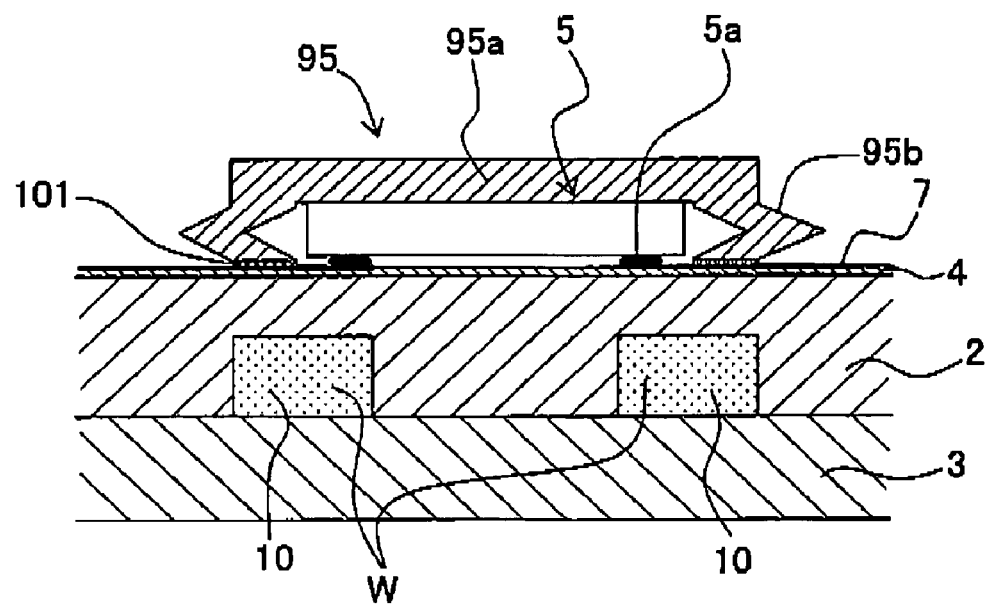
FIG. 14 shows a sectional view illustrating a fifth modified embodiment corresponding to FIG. 3A.

As shown in FIG. 14, legs 95b, which extend from a contact section 95a of a thermal conductive member 95, may have a shape capable of elastic deformation so that the thermal conductive member 95 can press IC 5 against the insulating material layer 4 by the aid of the elastic force of the legs 95b. In this arrangement, the legs 95b are contractible in the direction to allow the contact section 95a to approach the insulating material layer 4 in a state of being jointed to the insulating material layer 4. Therefore, the thermal conductive member 95 can press IC 5 against the insulating material layer 4. Accordingly, the terminal 5a of IC 5 and the wiring 7 can be directly joined to one another without using any solder or the like. Further, IC 5 and the contact section 95a reliably make close contact with each other. Therefore, the heat generated by IC 5 is efficiently transmitted to the thermal conductive member 95.

Sixth Modified Embodiment

Alternatively, any one of or both of the flow passage 10 and the heat sink 9 provided in the first embodiment may be omitted. In this arrangement, the heat generated by IC 5 is transmitted to the insulating material layer 4 and the plates 2, 3 via the thermal conductive member 80, and the heat is dissipated to the outside from the plates 2, 3. Although the transfer of the heat by the flow passage or the dissipation of the heat by the heat sink is not effected, the heat generated by IC 5 is efficiently transmitted by the thermal conductive member 80 having the high coefficient of thermal conductivity to the insulating material layer 4 and the plates 2, 3. Further, the insulating material layer 4 is composed of the ceramic material having the high coefficient of thermal conductivity, and each of the plates 2, 3 is composed of the metal having the high coefficient of thermal conductivity. Therefore, even in the case of this arrangement, it is possible to sufficiently dissipate the heat to the outside.

Second Embodiment

Figure 15:
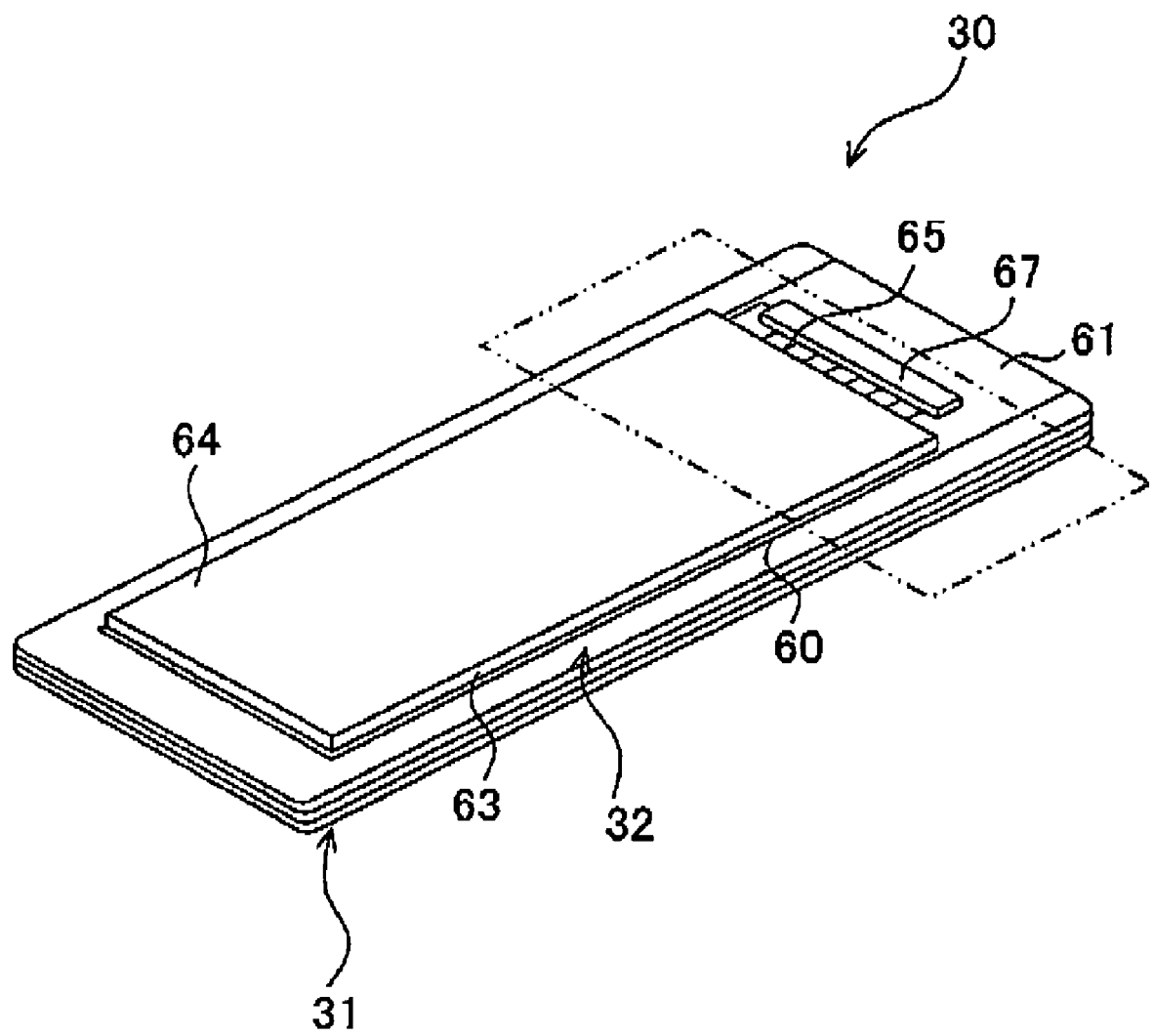
FIG. 15 shows a perspective view illustrating an ink-jet head according to a second embodiment of the present invention.

Next, an explanation will be made about a second embodiment of the present invention. The second embodiment is illustrative of a case in which the present invention is applied to an ink-jet head (liquid-jetting head) for discharging the ink (liquid) onto the recording paper. FIG. 15 shows a schematic perspective view illustrating the ink-jet head according to the second embodiment, FIG. 16 shows a plan view illustrating a portion surrounded by dashed lines shown in FIG. 15, and FIG. 17 shows a sectional view taken along a line XVII-XVII shown in FIG. 16.

Figure 16:
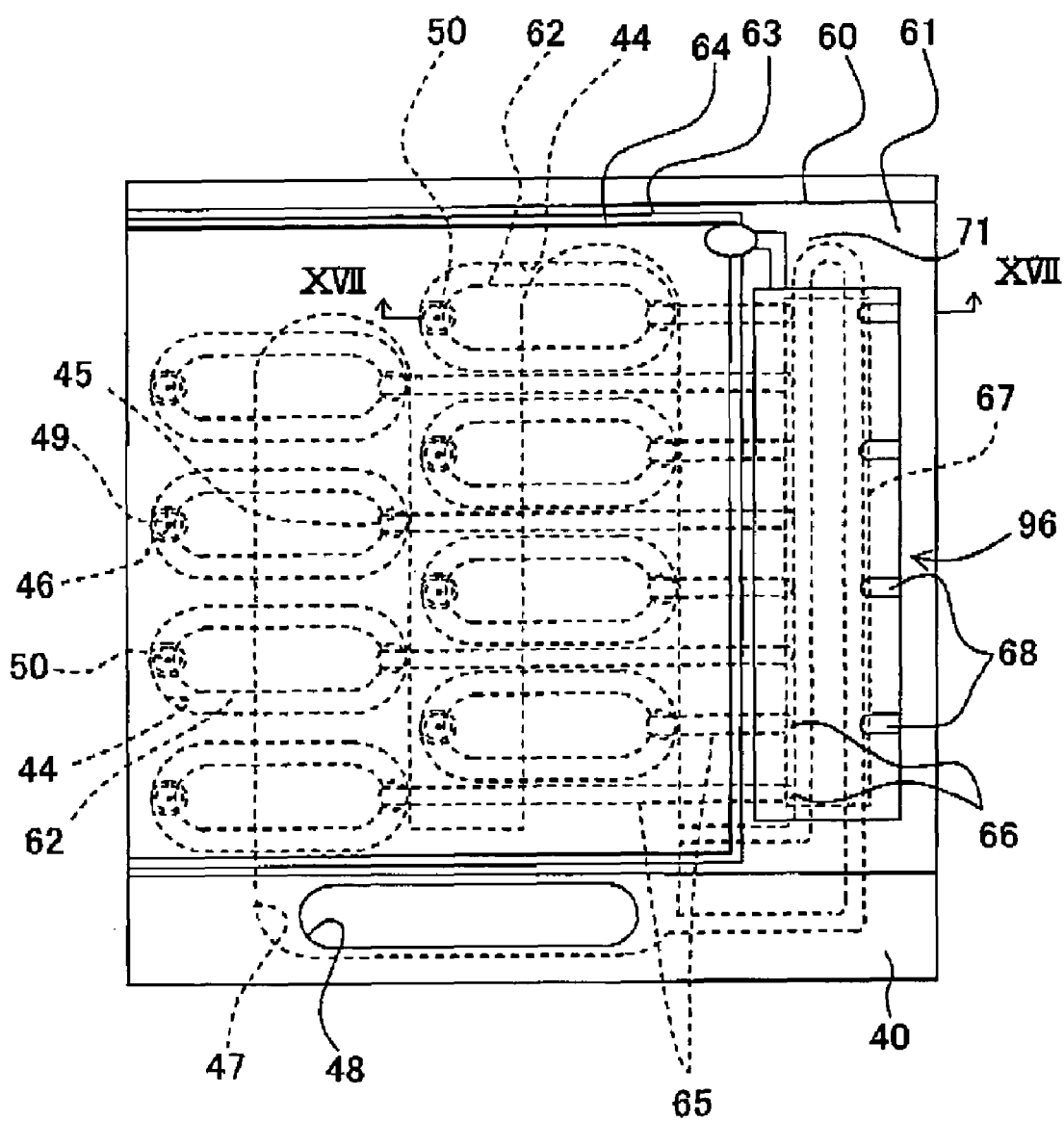
FIG. 16 shows a plan view illustrating a portion depicted by dashed lines in FIG. 14.
Figure 17:
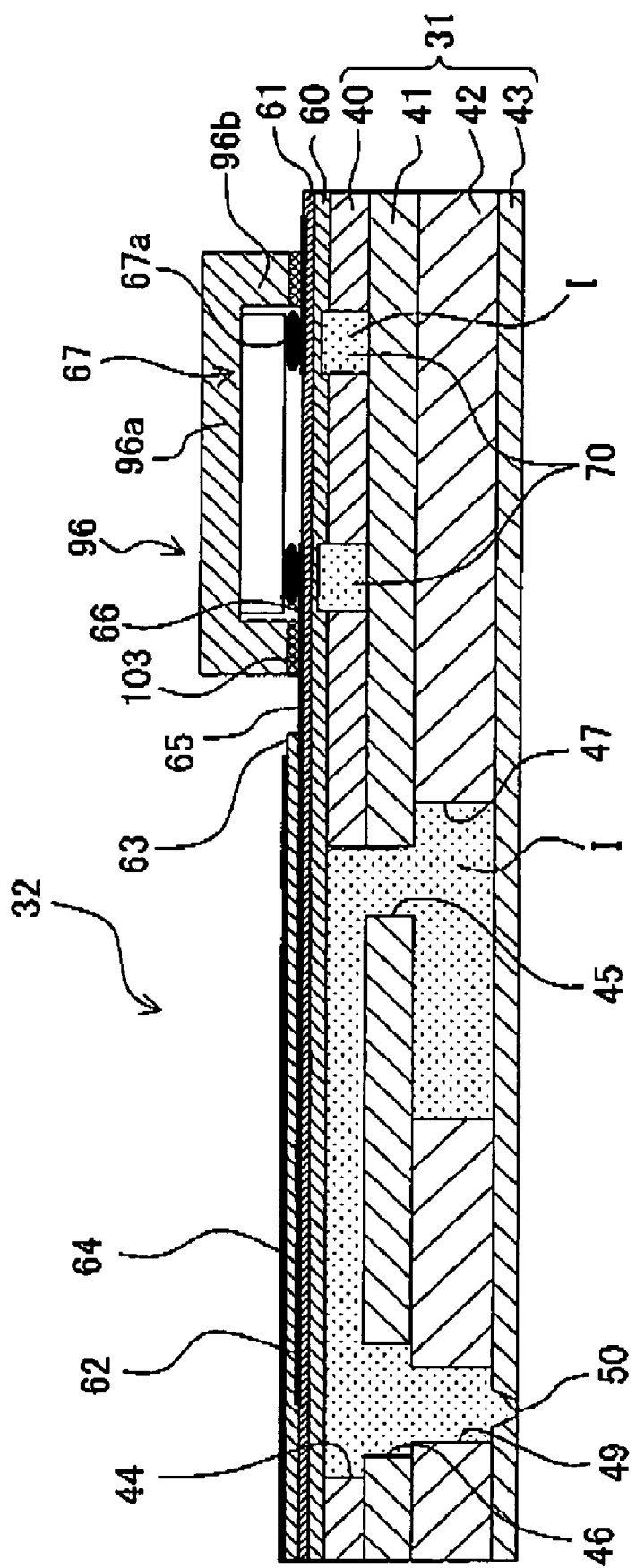
FIG. 17 shows a sectional view taken along a line XVII-XVII shown in FIG. 15.

As shown in FIGS. 15 to 17, the ink-jet head 30 of the second embodiment includes a flow passage unit 31 which includes individual ink flow passages formed therein, and an actuator 32 which is stacked on the upper surface of the flow passage unit 31.

At first, the flow passage unit 31 will be explained. As shown in FIGS. 15 to 17, the flow passage unit 31 includes a cavity plate 40, a base plate 41, a manifold plate 42, and a nozzle plate 43. The four plates 40 to 43 are adhered to one another in a stacked state. In particular, each of the cavity plate 40, the base plate 41, and the manifold plate 42 is a substantially rectangular plate made of stainless steel. The nozzle plate 43 is formed of, for example, a high molecular weight synthetic resin material such as polyimide, which is adhered to the lower surface of the manifold plate 42. Alternatively, the nozzle plate 43 may be also formed of a metal material such as stainless steel in the same manner as the three plates 40 to 42.

As shown in FIG. 17, the cavity plate 40 is formed with a plurality of pressure chambers 44 which are arranged along a flat surface. A part of the plurality of pressure chambers 44 (eight pressure chambers) are shown in FIG. 16. The respective pressure chambers 44 are formed to be substantially elliptical as viewed in a plan view, and they are arranged so that the major axis direction thereof is parallel to the longitudinal direction of the cavity plate 40.

communication holes 45, 46 are formed at positions of the base plate 41 overlapped with the both ends of the pressure chamber 44 in the major axis direction as viewed in a plan view respectively. The manifold plate 42 is formed with a manifold 47 which has portions arranged to extend in two arrays in the transverse direction of the manifold plate 42 (vertical direction in FIG. 16) and overlapped with substantially right halves of the pressure chambers 44 as viewed in a plan view as shown in FIG. 16. The ink I is supplied to the manifold 47 from an ink tank (not shown) via an ink supply port 48 formed in the cavity plate 40. Communication holes 49 are also formed at positions overlapped with the left ends of the pressure chambers 44 as viewed in a plan view as shown in FIG. 16. The nozzle plate 43 has a plurality of nozzles 50 which are formed at positions overlapped with the left ends of the plurality of pressure chambers 44 as viewed in a plan view respectively.

As shown in FIG. 17, the manifold 47 is communicated with the pressure chamber 44 via the communication hole 45. Further, the pressure chamber 44 is communicated with the nozzle 50 via the communication holes 46, 49. Accordingly, the individual ink flow passage, which extends from the manifold 47 via the pressure chamber 44 to arrive at the nozzle 50, is formed in the flow passage unit 31.

Next, the actuator 32 will be explained. As shown in FIG. 17, the actuator 32 includes a vibration plate 60 which is arranged on the surface of the flow passage unit 31, an insulating material layer 61 which is formed on the surface of the vibration plate 60, a plurality of individual electrodes 62 which are formed on the surface of the insulating material layer 61 and which correspond to the plurality of pressure chambers 44 respectively, a piezoelectric layer 63 which is formed on the surfaces of the plurality of individual electrodes 62, and a common electrode 64 which is formed on the surface of the piezoelectric layer 63 and which is provided commonly to the plurality of individual electrodes 62.

The vibration plate 60 is a plate made of metal (for example, stainless steel) having a substantially rectangular shape as viewed in a plan view. The vibration plate 60 is joined to the upper surface of the cavity plate 40 so that the plurality of pressure chambers 44 are covered therewith. The insulating material layer 61, which is composed of a ceramic material having a high coefficient of thermal conductivity such as alumina, zirconia, or silicon nitride, is formed on the surface of the vibration plate 60. The plurality of individual electrodes 62 are electrically insulated from each other by the insulating material layer 61.

A plurality of wiring sections 65 extend from first ends (right ends as shown in FIG. 17) of the plurality of individual electrodes 62 in parallel to the major axis direction of the individual electrodes 62 respectively on the surface of the insulating material layer 61. A plurality of terminal sections 66 are formed at the ends of the plurality of wiring sections 65 respectively. The height position is identical for all of the plurality of terminal sections 66. Terminals 67*a* of driver IC 67 (driving unit), which are provided to selectively supply the driving voltage to the plurality of individual electrodes 62, are joined to the plurality of terminal sections 66 corresponding to the plurality of individual electrodes 62 respectively. The driver IC 67 is arranged on the surface of the insulating material layer 61. The driver IC 67 is connected to a control unit (not shown) of an ink-jet printer, to which the ink-jet head 30 is provided, via a plurality of connecting terminals 68 formed on the surface of the insulating material layer 61 and a flexible wiring member (not shown) such as a flexible printed circuit board connected to the plurality of connecting terminals 68.

The piezoelectric layer 63, which is a solid solution of lead titanate and lead zirconate and which contains a major component of lead titanate zirconate (PZT) which is a ferroelectric material, is formed on the surfaces of the plurality of individual electrodes 62. The piezoelectric layer 63 is formed as one continuous layer ranging over all of the plurality of individual electrodes 62 so that the entire surfaces of the plurality of individual electrodes 62 are covered therewith. Further, the common electrode 64, which is common to the plurality of individual electrodes, is formed on the surface of the piezoelectric layer 63 over the entire surface of the piezoelectric layer 63. The common electrode 64 is also composed of a conductive material such as gold. AS shown in FIG. 16, the common electrode 64 is connected to the driver IC 67 by one wiring section 71. The common electrode 64 is grounded via the wiring section 71 and the driver IC 67, and is retained at the ground electric potential.

Next, an explanation will be made about the function of the actuator 32 during the discharge of the ink.

When the driving voltage is selectively supplied from the driver IC 67 to the plurality of individual electrodes 62 connected via the plurality of wiring sections 65 to the driver IC 67 respectively, a state is given, in which the electric potential differs between the individual electrode 62 supplied with the driving voltage and the common electrode 64 retained to have the ground electric potential. The electric field appears in the vertical direction in the piezoelectric layer 63 which is interposed between the both electrodes 62, 64. Accordingly, the portion of the piezoelectric layer 63, which is disposed just over the individual electrode 62 applied with the driving voltage, is contracted in the horizontal direction perpendicular to the vertical direction as the direction of polarization. In this situation, the vibration plate 60 and the insulating material layer 61 disposed under the piezoelectric layer 63 are fixed with respect to the cavity plate 40. Therefore, the portion of the piezoelectric layer 63 interposed between the both electrodes 62, 64, which covers the pressure chamber 44, is deformed so as to project toward the pressure chamber 44. As the piezoelectric layer 63 is partially deformed, the portion of the vibration plate 60, which covers the pressure chamber 44, is also deformed so as to project toward the pressure chamber 44. Accordingly, the volume in the pressure chamber 44 is decreased, and thus the ink pressure is increased. The ink I is discharged from the nozzle 50 communicated with the pressure chamber 44.

As shown in FIGS. 16 and 17, a thermal conductive member 96 made of metal is arranged on the upper surface of the driver IC 67 (surface on the side opposite to the insulating material layer 61). The thermal conductive member 96 has a planar (flat) contact section 96a which makes contact with the entire upper surface of the driver IC 67, and legs 96b which extend downwardly from the contact section 96a and which are joined to the insulating material layer 61 by the aid of an insulative adhesive 103.

Therefore, the heat generated by the driver IC 67 is transmitted via the thermal conductive member 96 to the insulating material layer 61 composed of a ceramic material having a high coefficient of thermal conductivity, the vibration plate 60 and the cavity plate 40 which are made of metal and have a high coefficient of thermal conductivity. The heat is transmitted via the vibration plate 60 and the cavity plate 40, and the heat is dissipated from the surface of the flow passage unit 31 constructed by the plates 40 to 43 made of metal. Therefore, the heat generated by the driver IC 67 can be reliably dissipated to the outside. It is possible to reliably avoid any excessive increase in the temperature of the driver IC 67.

Further, as shown in FIGS. 16 and 17, an ink flow passage 70 (liquid passage), which is communicated with the manifold 47, is formed in the vibration plate 60, the cavity plate 40, and the base plate 41 which are stacked in the area under the driver IC 67. The ink flow passage 70 is formed by the recess which is formed by the half etching on the vibration plate 60, the hole which is formed by the full etching in the cavity plate 40, and the upper surface of the base plate 41. The ink I contained in the ink flow passage 70 flows when the ink is attracted into the pressure chamber 44 from the manifold 47 during the discharge of the ink I from the nozzle 50. Accordingly, the ink I is circulated between the manifold 47 and the area under the driver IC 67.

In the case of the ink-jet head of the second embodiment explained above, the greater part of the heat generated by the driver IC 67 is transmitted via the thermal conductive member 96 made of metal having the high coefficient of thermal conductivity to the insulating material layer 61 composed of the ceramic material having the high coefficient of thermal conductivity, and the vibration plate 60 and the cavity plate 40 made of metal. The heat is dissipated to the outside. The heat, which is transmitted to the vibration plate 60 and the cavity plate 40, is transmitted to the ink flow passage 70. The flow of the ink I contained in the ink flow passage 70 to the manifold 47 allows the heat to be transferred to the position separated from the driver IC 67. Therefore, the ink I, which is provided to perform the recording on the recording medium, can be also used as the liquid for transferring the heat. Further, the actuator 32, which is provided to apply the discharge pressure to the ink I, can be also used as the pressurizing means to circulate the ink I in the ink flow passage 70. Therefore, the ink-jet head, to which the countermeasure is applied to dissipate the heat for the driver IC 67, can be cheaply constructed.

Various types of pressurizing means (for example, the pressurizing mechanism 8 of the first embodiment shown in FIGS. 4 and 5) for pressurizing the ink I in the liquid flow passage 70 and/or the heat sink (for example, the heat sink 9 of the first embodiment shown in FIGS. 6 and 7) for dissipating the heat transmitted to the ink I may be provided at any intermediate position of the liquid flow passage 70. The manifold 47 may make no communication with the liquid flow passage 70 provided in the area under the driver IC. The liquid, which circulates in the liquid flow passage 70, may be any liquid of another type such as water. That is, the liquid-jetting head of the present invention is not limited to the ink-jet head, but is usable also as the jetting head for the apparatus for jetting various liquids including, for example, water, solvent, and blood.

What is claimed is:

1. An electronic part-mounted substrate comprising:
   a base member which is made of metal;
   an insulating material layer which is formed of an insulating ceramic material on one surface of the base member;
   a heat-generating electronic part which is provided on a surface of the insulating material layer; and
   a thermal conductive member which makes contact with both of the electronic part and the insulating material layer;
   wherein the thermal conductive member makes contact with a surface of the electronic part different from another surface of the electronic part facing the insulating material layer.

2. The electronic part-mounted substrate according to claim 1,
   wherein the electronic part is provided with a casing having a plurality of surfaces, and the thermal conductive member makes contact with a flat surface of the plurality of surfaces, the flat surface having the largest area size among the surfaces.

3. The electronic part-mounted substrate according to claim 1,
   wherein a wiring, which is jointed to a terminal of the electronic part, is formed on the surface of the insulating material layer.

4. The electronic part-mounted substrate according to claim 1,
   wherein the thermal conductive member is formed of a metal material.

5. The electronic part-mounted substrate according to claim 1,
   wherein at least a part of a contact surface between the thermal conductive member and the insulating material layer is joined with an insulating adhesive.

6. The electronic part-mounted substrate according to claim 1,
   wherein the thermal conductive member and the insulating material layer are joined with a brazing material made of metal in an area in which no wiring is formed for the insulating material layer.

7. The electronic part-mounted substrate according to claim 1,
   wherein the thermal conductive member and the base member are directly joined with a joining member which penetrates through the insulating material layer.

8. The electronic part-mounted substrate according to claim 7,
   wherein the joining member is a bolt having thermal conductivity.

9. The electronic part-mounted substrate according to claim 1, wherein:

the thermal conductive member has a contact section which makes contact with the electronic part on a side opposite to the insulating material layer, and a leg which extends from the contact section to make contact with the insulating material layer; and the thermal conductive member is arranged on the surface of the insulating material layer so that the thermal conductive member covers at least a part of the electronic part as viewed in a direction perpendicular to one surface of the substrate.

10. The electronic part-mounted substrate according to claim 9, wherein:

a surface of the electronic part, which is disposed on the side opposite to the insulating material layer, is formed to be flat; and the contact section makes contact entirely with the surface of the electronic part disposed on the side opposite to the insulating material layer.

11. The electronic part-mounted substrate according to claim 9, wherein the leg makes contact with an area of the insulating material layer which surrounds an area in which the electronic part is provided.

12. The electronic part-mounted substrate according to claim 9, wherein:

the leg of the thermal conductive member is formed to be elastically deformable; and the thermal conductive member is capable of pressing the electronic part toward the insulating material layer by an elastic force of the leg.

13. The electronic part-mounted substrate according to claim 1, further comprising a heat sink which includes a plurality of projecting heat-dissipating sections and which is provided on a surface of a portion of the base member or the insulating material layer disposed closely to the electronic part.

14. The electronic part-mounted substrate according to claim 1, wherein a liquid flow passage, through which a liquid flows, is formed in the base member.

15. The electronic part-mounted substrate according to claim 14, wherein:

the thermal conductive member has a contact section which makes contact with the electronic part on a side opposite to the insulating material layer, and a leg which extends from the contact section to make contact with the insulating material layer; and the liquid flow passage is formed in the base member so that the liquid flow passage is positioned under the leg.

16. A thermal conductive member used for an electronic part-mounted substrate, the substrate including a base member made of metal, and an insulating material layer formed of an insulating ceramic material on one surface of the base member, the insulating material layer having a surface on which a heat-generating electronic part is provided, the thermal conductive member comprising:

a contact section which makes contact with the electronic part on a side opposite to the insulating material layer, and a leg which extends from the contact section to make contact with the insulating material layer, wherein the thermal conductive member is arranged on the surface of the insulating material layer to cover at least a part of the electronic part.

17. The thermal conductive member for the electronic part-mounted substrate according to claim 16, wherein the electronic part is provided with a casing having a plurality of surfaces, and the contact section is capable of making contact with a flat surface of the plurality of surfaces, the flat surface having the largest area size among the surfaces.

18. A liquid-jetting head comprising:

the electronic part-mounted substrate as defined in claim 1; and a flow passage unit which includes a nozzle which jets a liquid and a pressure chamber communicated with the nozzle, wherein:

the flow passage unit has a plurality of metal plates which are mutually stacked to form a liquid flow passage including the pressure chamber;

the base member made of metal is provided on one surface of the flow passage unit to cover the pressure chamber, the insulating material layer being formed of the insulating ceramic material on a surface of the base member made of metal on a side opposite to the flow passage unit;

the insulating material layer and the base member made of metal function as an actuator which changes a volume of the pressure chamber; and the electronic part is a driving unit which drives the actuator.

19. The liquid-jetting head according to claim 18, wherein the base member made of metal is a vibration plate.

20. The liquid-jetting head according to claim 19, wherein a liquid flow passage, through which the liquid flows, is formed in the metal plates.

21. The liquid-jetting head according to claim 19, wherein the liquid is an ink, and the liquid-jetting head is an ink-jet head.

* * * * *